(12) United States Patent
Lin

(10) Patent No.: US 11,157,399 B2
(45) Date of Patent: Oct. 26, 2021

(54) DATA STORAGE DEVICES AND DATA PROCESSING METHODS WITH DYNAMIC PROGRAMMING SCHEME

(71) Applicant: Silicon Motion, Inc., Jhubei (TW)

(72) Inventor: Wen-Sheng Lin, Kaohsiung (TW)

(73) Assignee: SILICON MOTION, INC., Jhubei (TW)

( * ) Notice: Subject to any disclaimer, the term of this patent is extended or adjusted under 35 U.S.C. 154(b) by 146 days.

(21) Appl. No.: 16/699,989

(22) Filed: Dec. 2, 2019

(65) Prior Publication Data
US 2020/0293441 A1  Sep. 17, 2020

(30) Foreign Application Priority Data

Mar. 13, 2019 (TW) ................................. 108108462

(51) Int. Cl.
| | |
|---|---|
| *G06F 12/02* | (2006.01) |
| *G11C 11/56* | (2006.01) |
| *G06F 12/06* | (2006.01) |
| *G06F 13/16* | (2006.01) |
| *G06F 12/0882* | (2016.01) |

(52) U.S. Cl.
CPC ...... *G06F 12/0246* (2013.01); *G06F 12/0292* (2013.01); *G06F 12/0638* (2013.01); *G06F 12/0882* (2013.01); *G06F 13/1694* (2013.01); *G11C 11/5628* (2013.01); *G11C 11/5642* (2013.01); *G06F 2212/7203* (2013.01); *G11C 2211/5641* (2013.01)

(58) Field of Classification Search
None
See application file for complete search history.

(56) References Cited

U.S. PATENT DOCUMENTS

| | | | | |
|---|---|---|---|---|
| 2009/0198952 A1* | 8/2009 | Khmelnitsky | ...... | G06F 12/0246 711/206 |
| 2009/0327584 A1* | 12/2009 | Tetrick | ................ | G06F 12/0866 711/103 |
| 2012/0079167 A1* | 3/2012 | Yao | ...................... | G06F 3/0659 711/103 |
| 2013/0046920 A1* | 2/2013 | Ryu | ..................... | G06F 12/0246 711/103 |

(Continued)

*Primary Examiner* — Nathan Sadler
(74) *Attorney, Agent, or Firm* — McClure, Qualey & Rodack, LLP

(57) ABSTRACT

A data storage device includes a memory device and a memory controller. The memory controller is configured to configure a first predetermined memory block which is an SLC memory block and a second predetermined memory block which is a MLC memory block as buffers to receive data. The memory controller determines to use which scheme to receive data in a predetermined period dynamically according to an amount of valid data stored in the memory device. When the memory controller determines to use a first scheme, the memory controller uses the first predetermined memory block to receive data. When the memory controller determines to use a second scheme, the memory controller uses the first predetermined memory block and the second predetermined memory block to receive data. When the memory controller determines to use a third scheme, the memory controller uses the second predetermined memory block to receive data.

8 Claims, 8 Drawing Sheets

(56) References Cited

U.S. PATENT DOCUMENTS

| | | | | |
|---|---|---|---|---|
| 2013/0304966 A1* | 11/2013 | Joo | ............ | G06F 12/0246 |
| | | | | 711/103 |
| 2014/0071753 A1* | 3/2014 | Shin | ............ | G11C 16/10 |
| | | | | 365/185.03 |
| 2017/0003892 A1* | 1/2017 | Sekido | ............ | G11C 16/10 |
| 2017/0052719 A1* | 2/2017 | Boitei | ............ | G06F 12/0246 |
| 2018/0211708 A1* | 7/2018 | Igahara | ............ | G06F 3/0679 |
| 2019/0095321 A1* | 3/2019 | Lin | ............ | G06F 3/0679 |
| 2019/0384517 A1* | 12/2019 | Lin | ............ | G06F 3/0673 |
| 2020/0073795 A1* | 3/2020 | Asano | ............ | G06F 3/0679 |

\* cited by examiner

| VP_Count_Table |
|---|
| 0 |
| 30 |
| 250 |
| 256144 |
| 20 |
| 0 |
| 100 |
| 150 |

FIG. 3

DATA STORAGE DEVICES AND DATA PROCESSING METHODS WITH DYNAMIC PROGRAMMING SCHEME

CROSS REFERENCE TO RELATED APPLICATIONS

This Application claims priority of Taiwan Patent Application No. 108108462, filed on Mar. 13, 2019, the entirety of which is incorporated by reference herein.

BACKGROUND OF THE INVENTION

Field of the Invention

The invention relates to a data storage device and a data processing method capable of speeding up the write operation of the memory device of the data storage device.

Description of the Related Art

With the rapid growth of data storage technology in recent years, many data storage devices—such as memory cards manufactured in compliance with the SD/MMC standards, CF standards, MS standards or XD standards, as well as solid state hard drives, Embedded Multi Media Cards (eMMC) and Universal Flash Storage (UFS)—have been used widely for a variety of purposes. Therefore, effective control of access to these data storage devices is an important issue.

In order to improve the access performance of the data storage device, a novel data processing method which is capable of improving the access performance of the memory device, especially speeding up the write operation of the memory device, is proposed.

BRIEF SUMMARY OF THE INVENTION

Data storage devices and data processing methods are provided. An exemplary embodiment of a data storage device comprises a memory device and a memory controller. The memory controller comprises a plurality of memory blocks. The memory controller is coupled to the memory device and configured to access the memory device. The memory controller configures a first predetermined memory block and a second predetermined memory block as buffers to receive data from a host device. The first predetermined memory block is an SLC memory block and the second predetermined memory block is an MLC memory block. The memory controller is configured to dynamically determine whether to use a first scheme, a second scheme or a third scheme to receive data in a predetermined period according to an amount of valid data stored in the memory device. When the memory controller determines to use the first scheme, the memory controller is configured to use the first predetermined memory block to receive data. When the memory controller determines to use the second scheme, the memory controller is configured to use the first predetermined memory block and the second predetermined memory block to receive data. When the memory controller determines to use the third scheme, the memory controller is configured to use the second predetermined memory block to receive data.

An exemplary embodiment of a data processing method for a data storage device comprising a memory device and a memory controller, wherein the memory device comprises a plurality of memory blocks, and the memory controller is coupled to the memory device and configured to access the memory device. The method is performed by the memory controller and comprises: selecting a plurality of memory blocks and configuring the memory blocks as at least an SLC memory block and at least an MLC memory block for being used as buffers to receive data from a host device; and dynamically determining to use either the SLC memory block and/or the MLC memory block to receive data in a predetermined period according to an amount of valid data stored in the memory device. When a first scheme is determined to be used, only the SLC memory block will be used to receive data in the predetermined period. When a second scheme is determined to be used, both the SLC memory block and the MLC memory block will be used to receive data in the predetermined period. When a third scheme is determined to be used, only the MLC memory block will be used to receive data in the predetermined period.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 3 is a diagram showing an exemplary valid page count table according to an embodiment of the invention;

DETAILED DESCRIPTION OF THE INVENTION

In order to make the objects, features and advantages of the invention more comprehensible, specific embodiments of the invention are set forth in the accompanying drawings. This description is made for the purpose of illustrating the general principles of the invention and should not be taken in a limiting sense. It should be understood that the following embodiments can be implemented by software, hardware, firmware, or any combination thereof. The scope of the invention is determined by reference to the appended claims.

Figure 1:
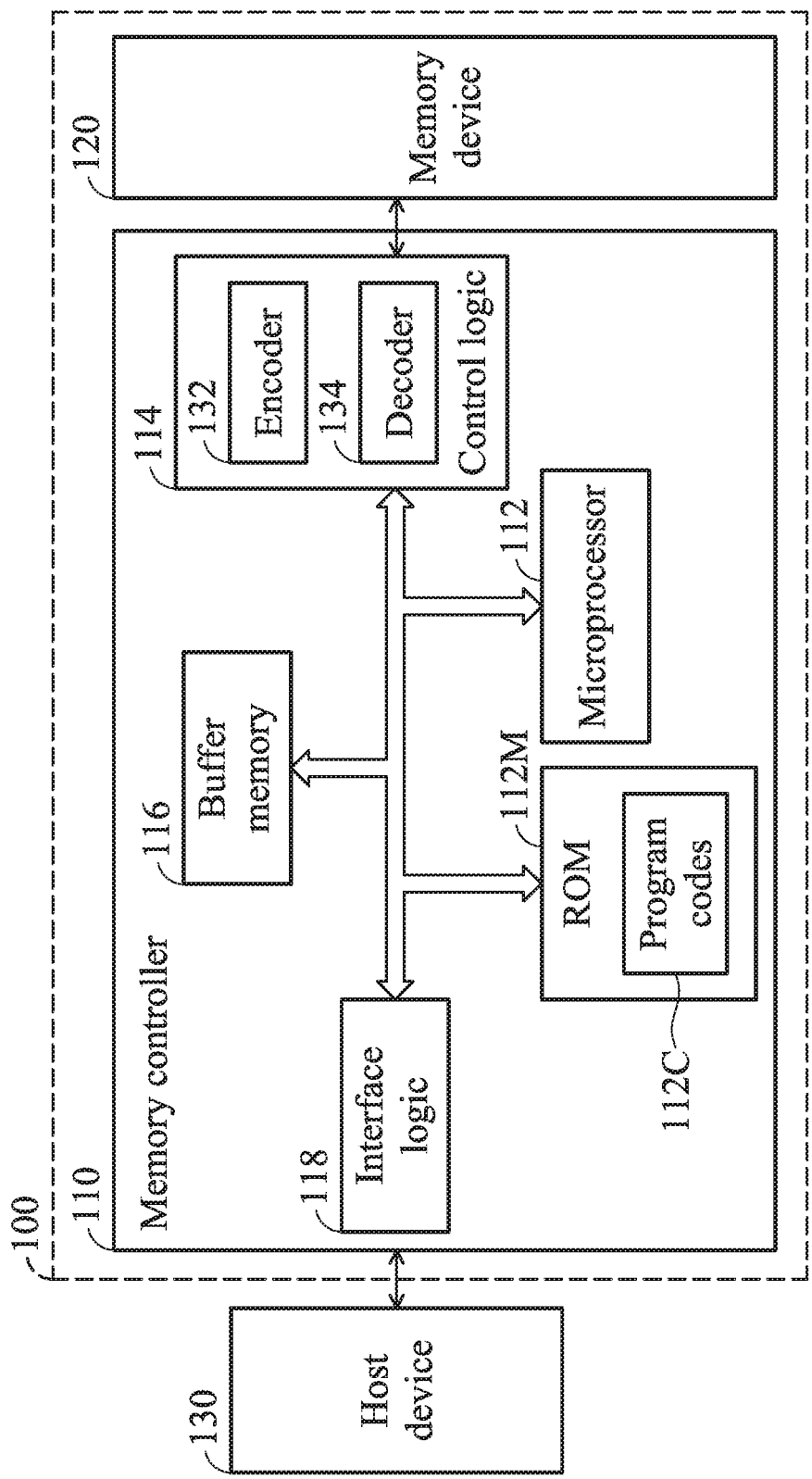
FIG. 1 shows an exemplary block diagram of a data storage device according to an embodiment of the invention.

FIG. 1 shows an exemplary block diagram of a data storage device according to an embodiment of the invention. The data storage device 100 may comprise a memory device 120, such as a flash memory module, and a memory controller 110. The memory controller 110 is configured to access the memory device 120. According to an embodiment of the invention, the memory controller 110 may comprise a microprocessor 112, a Read Only Memory (ROM) 112M, a control logic 114, a buffer memory 116 and an interface logic 118. The ROM 112M is configured to store program codes 112C. The microprocessor 112 is configured to execute the program codes 112C, thereby controlling access to the memory device 120. The control logic 114 may comprise an encoder 132 and a decoder 134. The encoder 132 is configured to encode the data to be written into the memory device 120 so as to generate corresponding correcting/checking code (also called error correction code (ECC)). The decoder 134 is configured decode the data read out from the memory device 120.

Typically, the memory device 120 may comprise a plurality of flash memory chips, and each flash memory chip may comprise a plurality of memory blocks. The access unit of an erase operation performed by the controller (e.g., the memory controller 110, through the execution of the program codes 112C by the microprocessor 112) on the memory device 120 may be one memory block. In addition, a memory block may record (comprise) a predetermined number of pages, that is, the physical pages, and the access unit of a write operation performed by the controller (e.g., the memory controller 110, through the execution of the program codes 112C by the microprocessor 112) on the memory device 120 may be one page.

In practice, the memory controller 110 may perform various control operations by using its own internal components through the execution of the program codes 112C by the microprocessor 112. For example, the memory controller 110 may use the control logic 114 to control the access operations (especially the access operation for at least a memory block or at least a page) of the memory device 120, use the buffer memory 116 to perform necessary data buffer operations, and use the interface logic 118 to communicate with a host device 130. In an embodiment of the invention, the memory controller 110 may use the interface logic 118 to communicate with a host device 130 in compliance with a standard communication protocol. For example, the standard communication protocol may comprise (but not limited to) the Universal Serial Bus (USB) standard, the Secure Digital (SD) interface standard, the Ultra High Speed-I (UHS-I) interface standard, the Ultra High Speed-II (UHS-II) interface standard, the Compact Flash (CF) interface standard, the Multimedia Card (MMC) interface standard, the Embedded Multimedia Card (eMMC) interface standard, the Universal Flash Storage (UFS) interface standard, the Advanced Technology Attachment (ATA) standard, the Serial ATA (SATA) standard, the Peripheral Component Interconnect Express (PCI-E) standard, the Parallel Advanced Technology Attachment (PATA) standard, etc.

In an embodiment, the buffer memory 116 may be implemented by a Random Access Memory (RAM). For example, the buffer memory 116 may be an SRAM, but the invention should not be limited thereto.

In an embodiment of the invention, the data storage device 100 may be a portable storage device (for example, the memory card in compliance with the SD/MMC, CF, MS and/or XD standard), and the host device 130 may be an electronic device, such as a mobile phone, a notebook computer, a desktop computer . . . etc., capable of connecting to the data storage device. In another embodiment of the invention, the data storage device 100 may be a solid state hard disk or an embedded storage device in compliance with the Universal Flash Storage (UFS) or the Embedded Multi Media Card (EMMC) standards, and may be equipped in an electronic device such as a mobile phone, a notebook computer, or a desktop computer. In such an embodiment, the host device 130 may be a processor of the electronic device.

The host device 130 may issue commands, such as the read command or the write command, to the data storage device 100, so as to access the data stored in the memory device 120, or the host device 130 may issue commands to further control or manage the data storage device 100.

According to an embodiment of the invention, the memory blocks comprised in the memory device 120 may be configured as the Single-Level Cell (SLC) memory blocks, the Multiple-Level Cell (MLC) memory blocks and/or the Triple-Level Cell (TLC) memory blocks. The memory cell of the SLC memory block is configured to store one bit data, the memory cell of the MLC memory block is configured to store two bits data, and the memory cell of the TLC memory block is configured to store three bits data.

Generally, the memory device 120 may be divided into three regions, comprising a system region, a data region and a spare region. The memory controller 110 is configured to select one or more predetermined memory blocks from the spare region as the cache memories, or called buffers, to receive data and buffer the data. When a predetermined memory block (that is, the buffer) is full (that is, has been fully written with data), the memory controller may further update the predetermined memory block currently being utilized as a buffer as a data block in the data region. For example, when the predetermined memory block currently being utilized as a buffer to receive data is an MLC or a TLC memory block, when the buffer is full, the predetermined memory block may be directly updated as a data block in the data region. When the predetermined memory block currently being utilized as a buffer to receive data is an SLC memory block, when a predetermined number of buffers are full, the memory controller may perform a garbage collection procedure to move the data stored in the buffers to an MLC or a TLC memory block (the target memory block) and update the target memory block as a data block in the data region.

Figure 2:
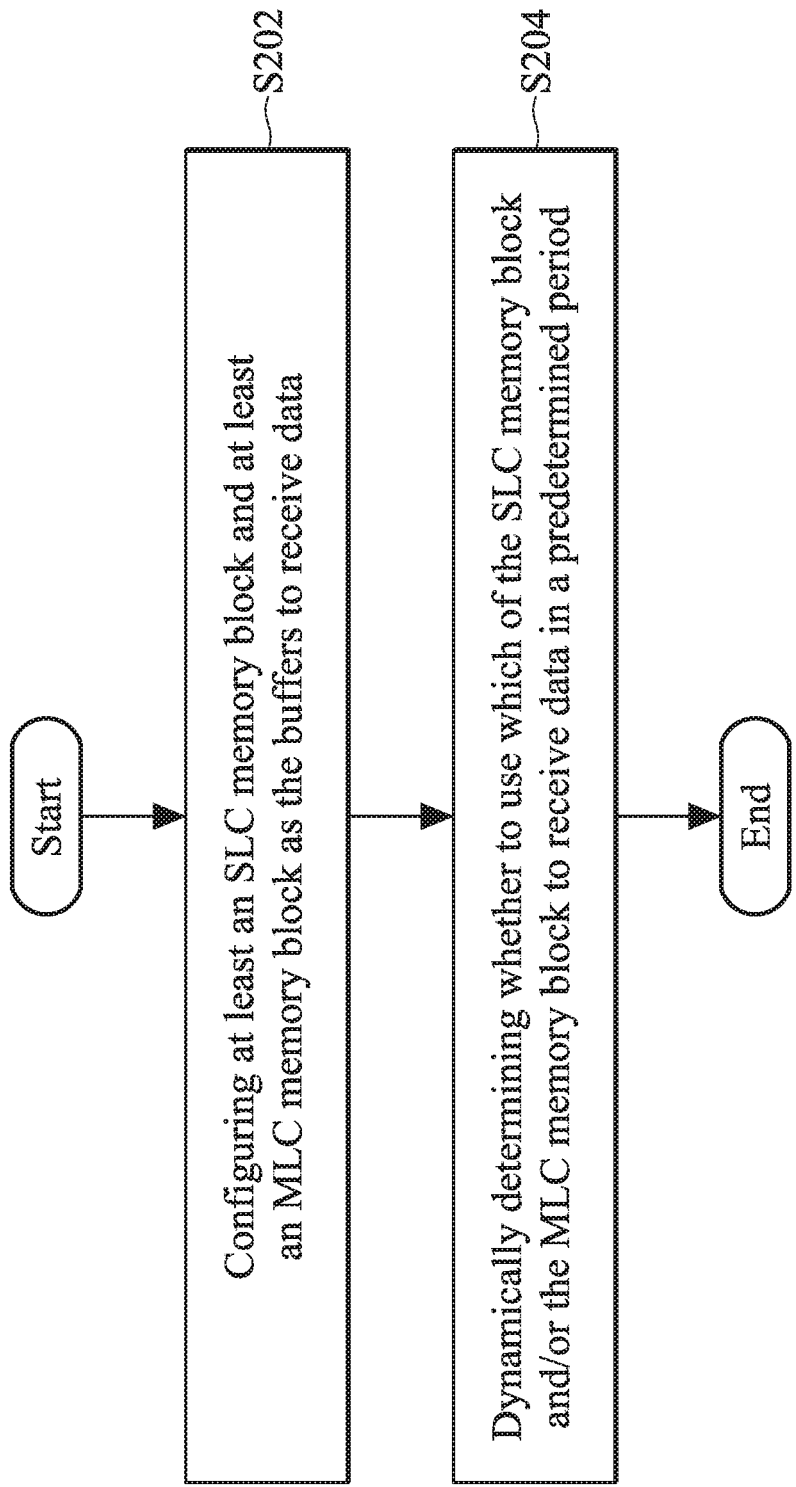
FIG. 2 is an exemplary flow chart of a data processing method according to an embodiment of the invention.

In order to effectively speeding up the write operation of the memory device, a novel data processing method is proposed. FIG. 2 is an exemplary flow chart of a data processing method according to an embodiment of the invention. According to an embodiment of the invention, the memory controller 110 may select a plurality of predetermined memory blocks as buffers and configure the predetermined memory blocks at least an SLC memory block and at least an MLC memory block for being used to receive data from the host device 130 (Step S202). Since the write performance of the SLC memory block and the write performance of the MLC memory block are different, for example, the write speed of writing data into the SLC memory block is usually faster than that of the MLC memory block, in the embodiments of the invention, the memory controller 110 may dynamically determine whether to use the SLC memory block and/or the MLC memory block to receive data in a predetermined period (Step S204), so as to speed up the write operation of the memory device.

According to an embodiment of the invention, the memory controller 110 is configured to determine whether to use a first scheme, a second scheme or a third scheme to receive data in the predetermined period according to the amount of valid data stored in the memory device. When the memory controller 110 determines to use the first scheme, the memory controller 110 is configured to use the predetermined memory block that is configured as the SLC memory block to receive data. When the memory controller 110 determines to use the second scheme, the memory controller 110 is configured to use both the predetermined memory block that is configured as the SLC memory block and the predetermined memory block that is configured as the MLC memory block to receive data. When the memory controller 110 determines to use the third scheme, the memory controller 110 is configured to use the predetermined memory block that is configured as the MLC memory block to receive data.

In the embodiment of the invention, when the memory controller 110 selects a predetermined memory block as the buffer to receive data, the memory controller 110 may determine to use an SLC mode or an MLC mode to erase the data stored in the selected predetermined memory block. When the memory controller 110 uses the SLC mode to erase the data stored in the selected predetermined memory block, the predetermined memory block will be configured as an SLC memory block. Similarly, when the memory controller 110 uses the MLC mode to erase the data stored in the selected predetermined memory block, the predetermined memory block will be configured as an MLC memory block.

According to an embodiment of the invention, the memory controller 110 may establish a valid page count table VP_Count_Table in the buffer memory 116 or the memory device 120 to record the value of a valid page count VP_Count corresponding to each memory block, wherein the unit of the recorded pages may be a logical page. Therefore, the maximum value of the valid page count VP_Count may be the number of logical pages comprised in one memory block, and the minimum value of the valid page count VP_Count may be 0. For example, the memory controller 110 may establish a valid page count table VP_Count_Table in the buffer memory 116, so as to record the value of the valid page count VP_Count of each data block in the data region, and may periodically update the content of the valid page count table VP_Count_Table recording the latest information in the buffer memory 116 to the memory device 120.

According to an embodiment of the invention, every time when the memory controller 110 has performed a write operation, the memory controller 110 may accordingly update the content of the valid page count table VP_Count_Tabl. Or, according to another embodiment of the invention, the memory controller 110 may update the content of the valid page count table VP_Count_Table according to the performance of one or more write operations after the memory controller 110 has performed the one or more write operations.

Figure 3:
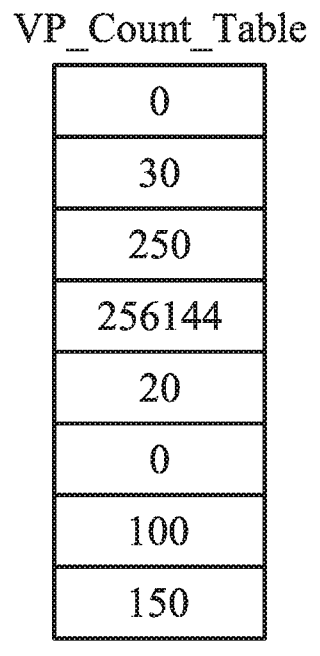

FIG. 3 is a diagram showing an exemplary valid page count table according to an embodiment of the invention. Suppose that the size of the memory device is 8 GB (bytes), and the size of a memory block is 1 GB, the size of a logical page may be set to 4 KB, and the number of logical pages comprised in one memory block (whose size can be expressed as 1024*256*4 KB) would be 262144. Therefore, the maximum value of the valid page count VP_Count is 262144 and the minimum value of the valid page count VP_Count may be 0. In the exemplary valid page count table shown in FIG. 3, the valid page count table VP_Count_Table comprises 8 fields to record the valid page count VP_Count of the 8 memory blocks comprised in the memory device 120. It should be noted that FIG. 3 merely shows a simplified valid page count table for easy understanding. The invention should not be limited to the size of the memory device, the size of a memory block and the size of a logical page as the example shown in FIG. 3.

According to an embodiment of the invention, the memory controller 110 may determine the amount of valid data stored in the memory device 120 according to content recorded in the valid page count table VP_Count_Table. It should be noted that in the embodiments of the invention, the memory controller 110 may obtain some more information regarding the amount of valid data according to the content recorded in the valid page count table VP_Count_Table. For example, the memory controller 110 may know the number of memory blocks storing few valid data, the number of empty memory blocks, or others. According to an embodiment of the invention, the memory blocks storing few valid data (or, a small amount of valid data) may be the memory blocks with a valid page count VP_Count that is lower than a threshold. The threshold may be set to, for example but not limited to, a half of the maximum value of the valid page count VP_Count (for example, the aforementioned 262144). In addition, the empty memory blocks may be the memory blocks with the valid page count VP_Count equal to 0. Therefore, in the embodiments of the invention, the memory controller 110 may determine which scheme is to be used to receive data from the host device according to the content recorded in the valid page count table VP_Count_Table. That is, the memory controller 110 may determine whether to use the SLC memory block, the MLC memory block or a combination thereof to receive data from the host device according to the content recorded in the valid page count table VP_Count_Table.

According to an embodiment of the invention, when the memory controller 110 determines that the amount of valid data stored in the memory device is not greater than a first value, the memory controller 110 may determine to use the first scheme to receive data in the predetermined period. According to an embodiment of the invention, the first value may be set to a value equal to the size of memory device 120 multiplied by a ratio that is smaller than 1, or, when the data size of data storage device is calculated based on the unit of the valid page count VP_Count, the first value may be set to a positive integer that is smaller than the total number of logical pages comprised in the memory device 120.

As discussed above, when the memory controller 110 determines to use the first scheme, the memory controller 110 may only use the predetermined memory block configured as the SLC memory block to receive data. Since the write speed of writing data into the SLC memory block is usually faster than that of the MLC memory block, using the SLC memory block as the buffer can significantly speed up the write operation of the memory device 120. In addition, since the amount of valid data currently stored in the memory device 120 is few, it means that the need of performing the garbage collection procedure is relatively low and performing the garbage collection procedure can bring higher benefits for the data storage device 100. Here, the benefit of performing a garbage collection procedure is related to the number of empty memory blocks that can be released after performing the garbage collection procedure. When the number of empty memory blocks that can be released after performing a garbage collection procedure is relative high, the benefit of performing the garbage collection procedure is relative high.

According to an embodiment of the invention, when the memory controller 110 determines that the amount of valid data stored in the memory device is greater than the first value, the memory controller 110 may further determine the number of memory blocks storing few valid data and determines whether the number of memory blocks storing few valid data is greater than a second value. The second value may be set to positive integer that is lower than the total number of memory blocks comprised in the memory device 120. When the number of memory blocks storing few valid data is not greater than the second value, the memory controller may also determine to use the first scheme to receive data in the predetermined period. Since now there are a small number of memory blocks storing few valid data, it means that the need of performing the garbage collection procedure is relatively low. The memory controller 110 may determine to keep using the first scheme to receive data.

On the other hand, when the number of memory blocks storing few valid data is greater than the second value, it means that the need of performing the garbage collection procedure is relatively high. Therefore, the memory controller 110 may determine to start using the predetermined memory block configured as the MLC memory block for receiving data, so as to reduce the number of times of performing the garbage collection procedure (as compared to the case when the first scheme is adopted). According to an embodiment of the invention, when the number of memory blocks storing few valid data is greater than the second value, the memory controller 110 may directly determine to use the second scheme to receive data. As discussed above, when the memory controller 110 determines to use the second scheme to receive data, the memory controller 110 is configured to use both the predetermined memory block that is configured as the SLC memory block and the predetermined memory block that is configured as the MLC memory block to receive data.

According to another embodiment of the invention, when the number of memory blocks storing few valid data is greater than the second value, the memory controller 110 may further calculate the number of empty memory blocks in the memory device 120 and determine whether the number of empty memory blocks in the memory device 120 is lower than a third value. When the memory controller determines that the number of empty memory blocks is not lower than the third value, the memory controller 110 may determine to use the second scheme to receive data in the predetermined period.

According to an embodiment of the invention, when the second scheme is adopted, the memory controller 110 may determine whether to write the data into the predetermined memory block configured as the SLC memory block or into the predetermined memory block configured as the MLC memory block according to the amount or size of data to be written into the buffer. The predetermined memory block configured as the MLC memory block may be designed to store contiguous data or great amount or large size of data, for example, the data of a plurality of contiguous logical pages. The predetermined memory block configured as the SLC memory block may be designed to store random or a small amount or small size of data. According to an embodiment of the invention, when the amount of data to be written into the buffer is greater than or equal to a predetermined amount (for example, the amount of data capable of being written in one write operation of writing the MLC memory block), or when the amount of data to be written into the buffer is an integer multiple of the predetermined amount, the memory controller 110 may determine to write the data (or, a portion of the data) into the predetermined memory block configured as the MLC memory block. On the other hand, when the amount of data to be written into the buffer is less than the predetermined amount, the memory controller 110 may determine to write the data into the predetermined memory block configured as the SLC memory block.

For example, suppose that the data of two physical pages will be written into an MLC memory block when executing a One-shot programming command, the predetermined amount may be set to 16K(bytes)*2=32K(bytes), where 16K(bytes) is the size of one physical page. When the size or the amount of data to be written in a write command is 36K(bytes), the memory controller 110 may determine to write the 32K(bytes) among this 36K(bytes) data into the predetermined memory block configured as the MLC memory block, and write the remaining 4K(bytes) data into the predetermined memory block configured as the SLC memory block.

In addition, when the memory controller 110 determines that the number of empty memory blocks is lower than the third value, it means that the residual memory space of the memory device 120 is small, the memory controller 110 may determine to use the third scheme to receive data in the predetermined period. As discussed above, when the memory controller 110 determines to use the third scheme, no matter the data to be written into the buffer is contiguous data, great amount or large size of data, or random or small amount/size of data, the memory controller 110 will only use the predetermined memory block configured as the MLC memory block to receive data. Since the residual memory space of the memory device 120 is now small, using the MLC memory block as the buffer can reduce the speed of consuming the empty memory blocks and reduce the number of times that the memory controller 110 has to perform the garbage collection procedure.

As discussed above, when the buffer is full, the memory controller 110 may update the predetermined memory block currently being utilized as buffer to the data block in the data region. At this time, according to an embodiment of the invention, the memory controller 110 may re-determine whether to use the first scheme, the second scheme or the third scheme to receive data in the next predetermined period. Therefore, according to an embodiment of the invention, the predetermined period may at lease comprise the period started from the time when the memory controller 110 configures a new memory block as the buffer and determines which scheme is to be used to receive data, till the time when at least one buffer is full and the memory controller 110 has to configure another new memory block as the buffer.

When re-determining the scheme to receive data, the memory controller 110 may also make the decision based on the aforementioned determination rules to determine whether to use the first scheme, the second scheme or the third scheme to receive data in the next predetermined period.

According to an embodiment of the invention, since the memory controller 110 determines to use the predetermined memory block configured as the SLC memory block as the buffer to receive data when the residual memory space of the memory device 120 is large, the amount of valid data is small or when the number of memory blocks storing few valid data is small, the write operation of the memory device 120 can be sped up and the user will not feel the write operation of the memory device 120 is sluggish. When the memory controller 110 determines that the amount of valid data is large or determines that the needs of performing the garbage collection procedure is increasing since the valid data is scattered in the memory device 120, the memory controller 110 may determine to write the contiguous data or great amount or large size of data to the predetermined memory block configured as the MLC memory block. In this manner, the number of times that the memory controller 110 has to perform the garbage collection procedure can be reduced.

When the residual memory space of the memory device 120 is insufficient, the memory controller 110 may use the predetermined memory block configured as the MLC memory block as the buffer to receive data, so as reduce the speed of consuming the empty memory blocks and reduce the times of performing the garbage collection procedure. Since the system hardware resources will be occupied by the memory controller 110 when performing the garbage collection procedure, the speed of the write operation will be accordingly affected. By applying the proposed data processing method, the memory controller is configured to dynamically determine to use the SLC memory block and/or the MLC memory block as a buffer to receive data. In this manner, the write operation can be sped up during the period of time when the SLC memory block is used as the buffer to receive data, and the number of times that the memory controller 110 has to perform the garbage collection procedure can be reduced during the period of time when the MLC memory block is used as the buffer to receive data. In this manner, the user will not feel the write operation of the memory device 120 is sluggish.

Figure 4:
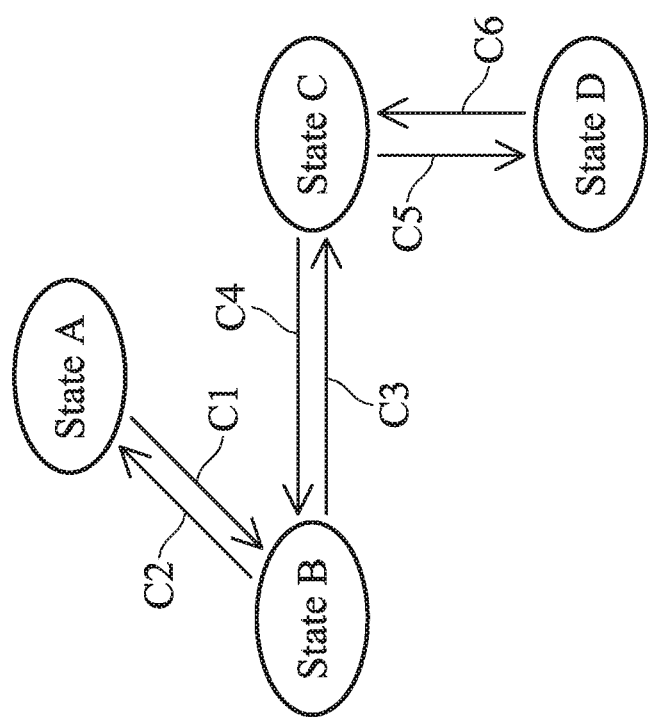
FIG. 4 shows an exemplary finite state machine according to an embodiment of the invention.

FIG. 4 shows an exemplary finite state machine according to an embodiment of the invention. The memory controller 110 may start the operations from state A. In state A, the memory controller 110 is configured to use the first scheme to receive data. That is, in state A, the memory controller 110 only use the predetermined memory block configured as the SLC memory block as buffer to receive data. As discussed above, when the buffer is full, the memory controller 110 may re-determine which scheme is to be used to receive data. When the condition C1 is satisfied, the state is transited from state A to state B. According to an embodiment, the condition C1 is that the amount of valid data stored in the memory device 120 is greater than a first value. For example, the first value may be set as ¼ of the size of the memory device 120.

In state B, the memory controller 110 may still use the first scheme to receive data. That is, the memory controller 110 only use the predetermined memory block configured as the SLC memory block as buffer to receive data. It should be noted that in the embodiments of the invention, the state transient can be bidirectional. That is, when the memory controller 110 re-determine which scheme to use to receive data, when the condition C2 is satisfied, the state can be transited from state B back to state A. According to an embodiment of the invention, the condition C2 may be that the amount of valid data stored in the memory device 120 is not greater than the first value.

As discussed above, when the buffer is full, the memory controller 110 is configured to re-determine which scheme to use to receive data. In the state B, when the condition C3 is satisfied, the state is transited from state B to state C. According to an embodiment of the invention, the condition C3 may be that the number of memory blocks storing few valid data is greater than a second value. For example, the second value may be set to ⅜ of the total number of memory blocks comprised in the memory device 120. Similarly, the state transient can be bidirectional. That is, when then the memory controller 110 re-determine which scheme to use thereafter to receive data and when the condition C4 is satisfied, the state can be transited from state C back to state B. According to an embodiment of the invention, the condition C4 may be that the number of memory blocks storing few valid data is not greater than the second value.

In state C, the memory controller 110 may use the second scheme to receive data. That is, both the predetermined memory block configured as the SLC memory block and the predetermined memory block configured as the MLC memory block will be used as the buffers to receive data.

In addition, similarly, when the memory controller 110 re-determine which scheme is to be used to receive data thereafter and when the condition C5 is satisfied, the state is transited from state C to state D. In state D, the memory controller 110 may use the third scheme to receive data. That is, the memory controller 110 only use the predetermined memory block configured as the MLC memory block as buffer to receive data. In addition, when the condition C6 is satisfied, the state can be transited from state D back to state C. According to an embodiment of the invention, the condition C5 may be that the number of empty memory blocks in the memory device is lower than a third value, and the condition C6 may be that the number of empty memory blocks in the memory device is not lower than the third value. For example, the third value may be set as ¼ of the size of the memory device 120.

It should be noted that in this embodiment, the memory controller 110 may control the aforementioned scheme to be changed from state A to state B, from state B to state C, from state C to state D or from state D back to state C, from state C back to state B and from state B back to state A. Therefore, in this embodiment, the scheme of using which type of memory block as the buffer will be changed only in this manner from the scheme of using only the SLC memory block as the buffer to the scheme of using both the MLC memory block and the SLC memory block as the buffers, and then changed to the scheme of using only the MLC memory block as the buffer, and vice versa. In other words, in this embodiment, the memory controller 110 will not directly change the scheme from the first scheme of using only the predetermined memory block configured as the SLC memory block as the buffer to the third scheme of using only the predetermined memory block configured as the MLC memory block as the buffer, and vice versa.

Figure 5A:
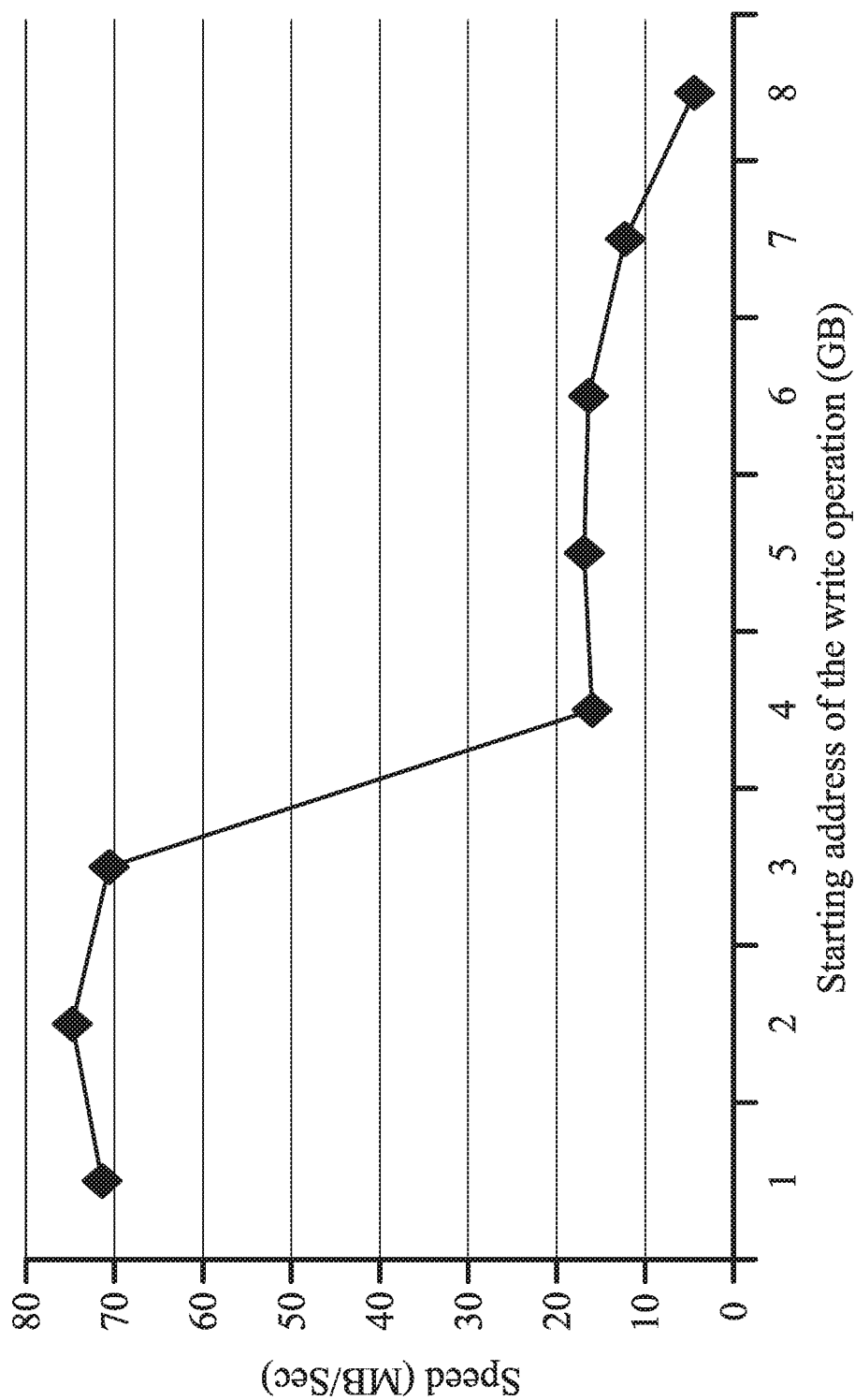
FIG. 5A and FIG. 5B are the diagrams showing the write performance when using only the SLC memory block as buffer according to an embodiment of the invention.
Figure 5B:
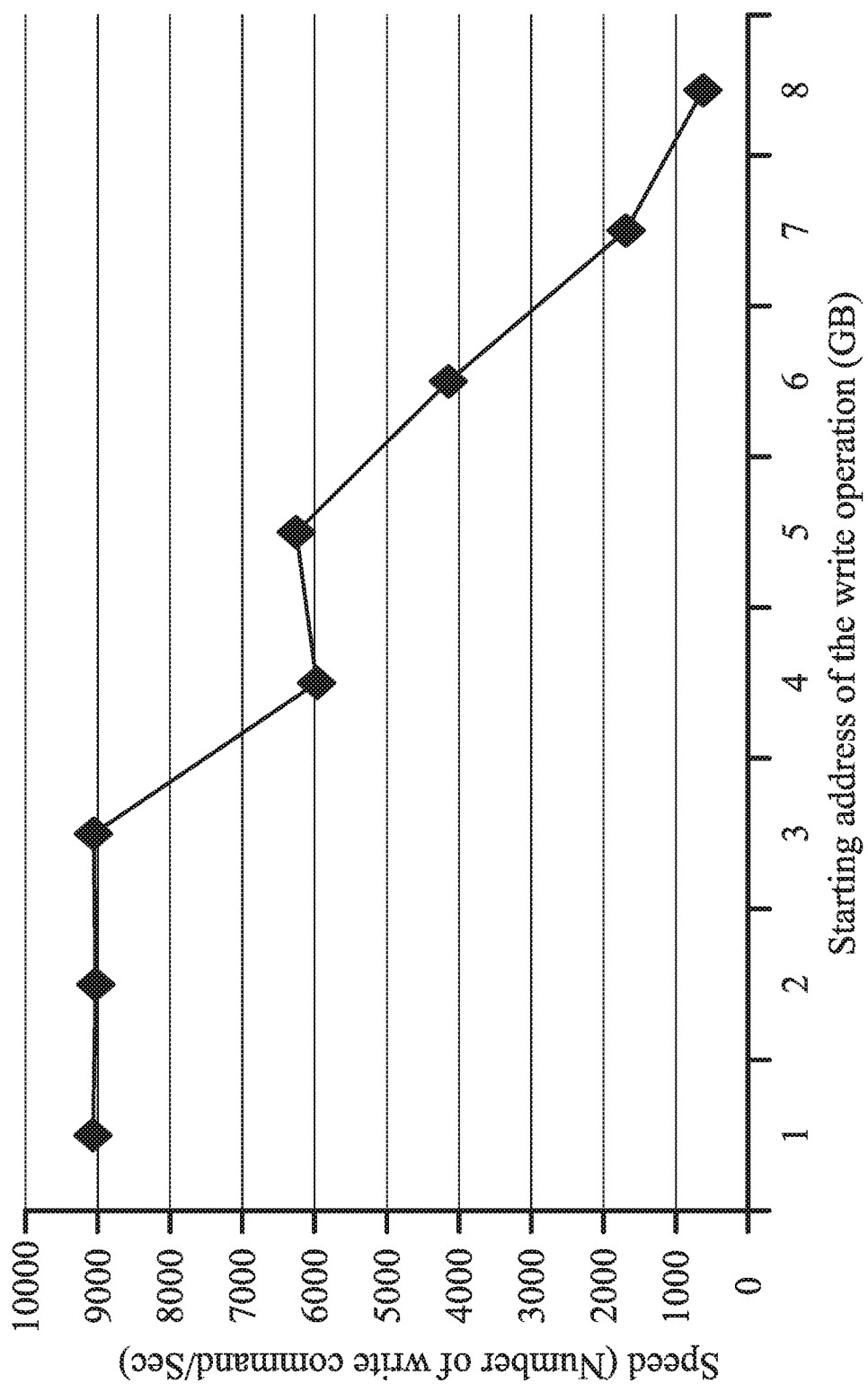

FIG. 5A and FIG. 5B are the diagrams showing the write performance when using only the SLC memory block as buffer according to an embodiment of the invention. FIG. 5A shows the test results using the contiguous data or great amount or large size of data as the test pattern. FIG. 5B shows the test results using the random or the small amount or small size of data as the test pattern. The Y-axis shows the write speed when performing the write operation, and the X-axis shows the starting address (GB) of the corresponding write operation. In FIG. 5A, the unit of the write speed is megabytes per second (MB/Sec). In FIG. 5B, the unit of the write speed is the number of write command per second, where each write command is configured to write 4 KB data. From the left hand side to the right hand side along the X-axis, the change of write speed as the residual memory space of the memory device 120 is decreasing is shown.

As shown in FIG. 5A, starting from the position when the residual memory space of the memory device 120 is no more than ⅝ of the total size of the memory device 120, since the memory controller 110 has to start to perform the garbage collection procedure in the background, the write speed is significantly degraded. As shown in FIG. 5B, starting from the position when the residual memory space of the memory device 120 is no more than ½ the total size of the memory device 120, the write speed is also significantly degraded.

Figure 6A:
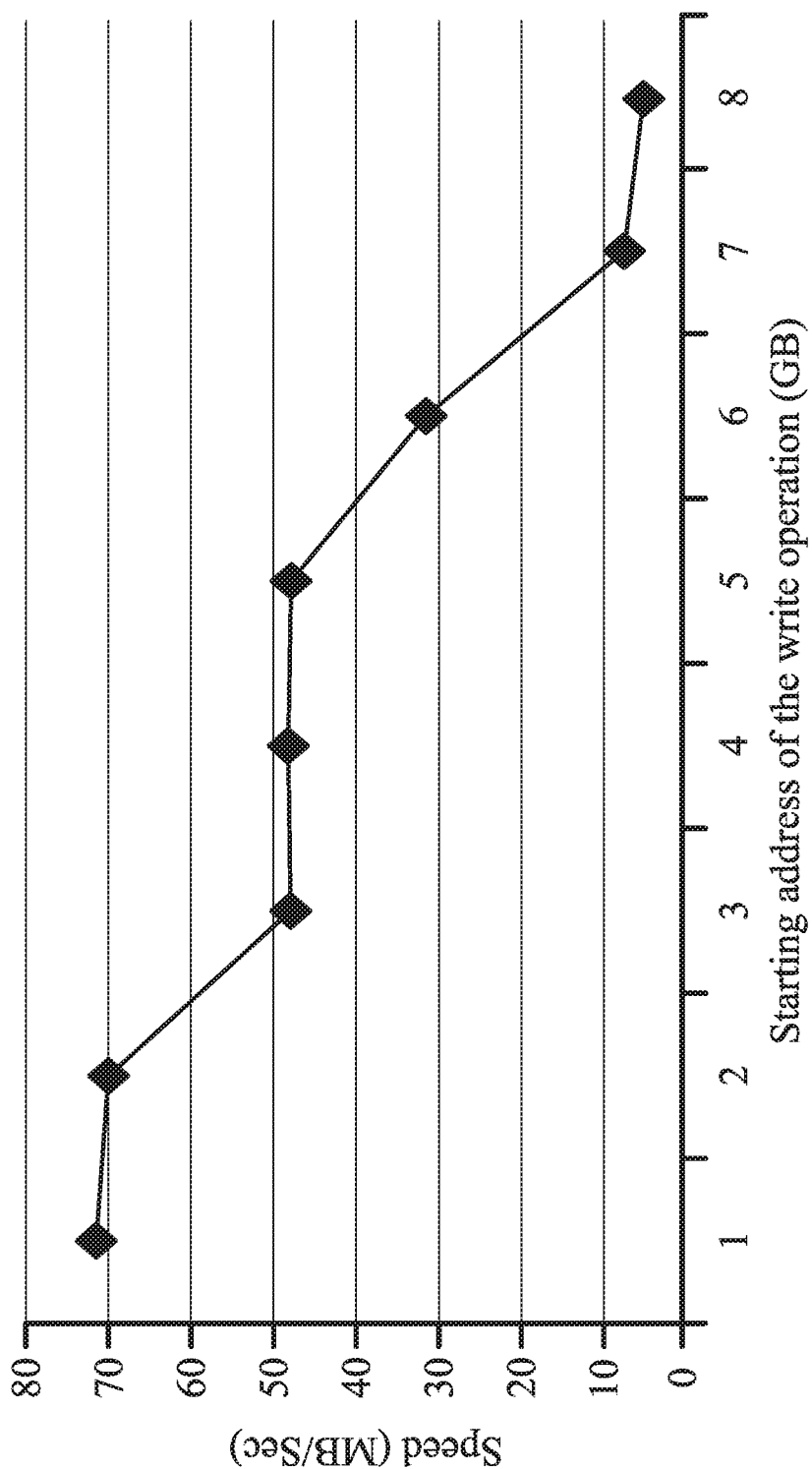
FIG. 6A is a diagram showing the write performance when applying the proposed data processing method to the write operations of writing contiguous data or great amount or large size of data according to an embodiment of the invention.
Figure 6B:
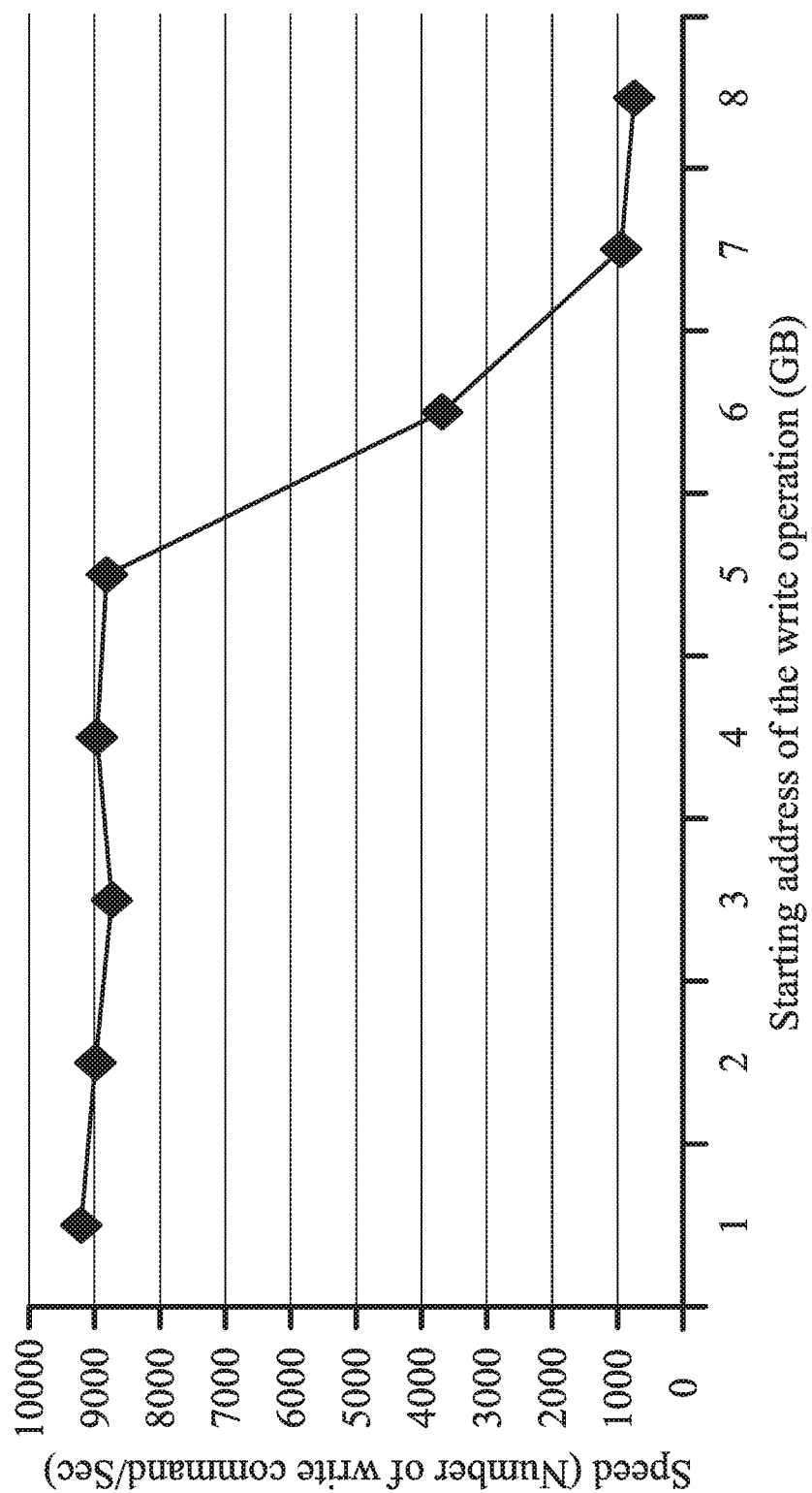
FIG. 6B is a diagram showing the write performance when applying the proposed data processing method to the write operations of writing random or the small amount or small size of data according to an embodiment of the invention.

FIG. 6A is a diagram showing the write performance when applying the proposed data processing method to the write operations of writing contiguous data or great amount or large size of data according to an embodiment of the invention. FIG. 6B is a diagram showing the write performance when applying the proposed data processing method to the write operations of writing random or the small amount or small size of data according to an embodiment of the invention. Similarly, the Y-axis shows the write speed when performing the write operation, and the X-axis shows the starting address (GB) of the corresponding write operation. In FIG. 6A, the unit of the write speed is megabytes per second (MB/Sec). In FIG. 6B, the unit of the write speed is the number of write command per second, where each write command is configured to write 4 KB data. From the left hand side to the right hand side along the X-axis, the change of write speed as the residual memory space of the memory device 120 is decreasing is shown.

As shown in FIG. 6A and FIG. 6B, by applying the proposed data processing method, since the memory controller 110 is configured to use the first scheme first, the initial write performance may be substantially the same as the examples shown in FIG. 5A and FIG. 5B. When the residual memory space of the memory device 120 is no more than ⅝ of the total size of the memory device 120, the memory controller 110 is configured to use the second scheme. Therefore, as compared to the examples shown in FIG. 5A and FIG. 5B, the write performance will not be significantly degraded. Instead, by applying the proposed data processing method, good performance can still be kept. The memory controller 110 will not use the third scheme until the residual memory space of the memory device 120 is reduced to only ⅛ or ¼ the total size of the memory device 120. When the third scheme is adopted, since the memory controller 110 only uses the MLC memory block as the buffer to receive data and has to perform the garbage collection procedure in the background, the write performance is degraded to the extent approaching the examples shown in FIG. 5A and FIG. 5B.

From FIG. 6A and FIG. 6B, it can be seen that the proposed data processing method can effectively speed up the write operation of the memory device. In the embodiment of the invention, by dynamically determining whether to use the SLC memory block and/or the MLC memory block to receive data in the following predetermined period, the configuration of the buffers can be flexibly adjusted based on the residual memory space of the memory device 120 and the amount of valid data and the distribution of valid data in the memory device 120. By applying the proposed data processing method, during the period of time when using the SLC memory block as the buffer, the write operations of the memory device 120 can be significantly sped up. In addition, during the period of time when using the MLC memory block as the buffer, the number of times of performing the garbage collection procedure can be effectively reduced and the user will not feel the write operation of the memory device 120 is sluggish. Therefore, both the write speed and the write performance experienced by the user can be significantly improved.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data storage device, comprising:
a memory device, comprising a plurality of memory blocks; and
a memory controller, coupled to the memory device and configured to access the memory device, wherein the memory controller configures a first predetermined memory block and a second predetermined memory block as buffers to receive data from a host device, the first predetermined memory block is an SLC memory block and the second predetermined memory block is an MLC memory block,
wherein:
the memory controller is configured to dynamically determine whether to use a first scheme, a second scheme or a third scheme to receive data in a predetermined period according to an amount of valid data stored in the memory device, a number of memory blocks storing few valid data, and a number of empty memory blocks in the memory device, wherein the memory blocks storing few valid data have valid page counts lower than a threshold;
when the memory controller determines that the amount of valid data stored in the memory device is not greater than a first value, the memory controller determines to use the first scheme to receive data in the predetermined period;
when the memory controller determines that the amount of valid data stored in the memory device is greater than the first value and the number of memory blocks storing few valid data is not greater than a second value, the memory controller determines to use the first scheme to receive data in the predetermined period;
when the memory controller determines that the number of memory blocks storing few valid data is greater than the second value and the number of empty memory blocks in the memory device is not lower than a third value, the memory controller determines to use the second scheme to receive data in the predetermined period;
when the number of empty memory blocks in the memory device is lower than the third value, the memory controller determines to use the third scheme to receive data in the predetermined period;
when the memory controller determines to use the first scheme, the memory controller is configured to use the first predetermined memory block to receive data, when the memory controller determines to use the second scheme, the memory controller is configured to use the first predetermined memory block and the second predetermined memory block to receive data, and when the memory controller determines to use the third scheme, the memory controller is configured to use the second predetermined memory block to receive data; and
according to the second scheme, write data is first programmed into the second predetermined memory block by one-shot programming and, after the one-shot programming, a remaining part of the write data is programmed into the first predetermined memory block.

2. The data storage device as claimed in claim 1, wherein the memory controller further establishes a first table to record a value of a valid page count corresponding to each memory block, and wherein the memory controller determines the amount of valid data stored in the memory device according to content recorded in the first table.

3. The data storage device as claimed in claim 2, wherein the memory controller is further configured to update the content recorded in the first table according to performance of one or more write operations after the one or more write operations have been performed.

4. The data processing method as claimed in claim 1, wherein when the predetermined period expires, the memory controller is configured to re-determine whether to use the first scheme, the second scheme or the third scheme to receive data in the next predetermined period.

5. A data processing method for a data storage device comprising a memory device and a memory controller, wherein the memory device comprises a plurality of memory blocks, the memory controller is coupled to the memory device and configured to access the memory device, the method is performed by the memory controller and comprises:
   selecting a plurality of memory blocks and configuring the memory blocks as at least an SLC memory block and at least an MLC memory block for being used as buffers to receive data from a host device; and
   dynamically determining to use the SLC memory block or the MLC memory block or both the SLC memory block and the MLC memory block to receive data in a predetermined period according to an amount of valid data stored in the memory device, a number of memory blocks storing few valid data, and a number of empty memory blocks in the memory device, wherein the memory blocks storing few valid data have valid page counts lower than a threshold;
   wherein:
   when the amount of valid data stored in the memory device is not greater than a first value, a first scheme is applied to receive data in the predetermined period;
   when the amount of valid data stored in the memory device is greater than the first value and the number of memory blocks storing few valid data is not greater than a second value, the first scheme is applied to receive data in the predetermined period;
   when the number of memory blocks storing few valid data is greater than the second value and the number of empty memory blocks in the memory device is not lower than a third value, a second scheme is applied to receive data in the predetermined period;
   when the number of empty memory blocks in the memory device is lower than the third value, a third scheme is applied to receive data in the predetermined period;
   when the first scheme is determined to be used, only the SLC memory block will be used to receive data in the predetermined period, when the second scheme is determined to be used, both the SLC memory block and the MLC memory block will be used to receive data in the predetermined period, and when the third scheme is determined to be used, only the MLC memory block will be used to receive data in the predetermined period;
   according to the second scheme, write data is first programmed into the MLC memory block by one-shot programming and, after the one-shot programming, a remaining part of the write data is programmed into the SLC memory block.

6. The data processing method as claimed in claim 5, further comprising:
   establishing a first table to record a value of a valid page count corresponding to each memory block, wherein the amount of valid data stored in the memory device is determined according to content recorded in the first table.

7. The data processing method as claimed in claim 6, further comprising:
   updating the content recorded in the first table according to performance of one or more write operations after the one or more write operations have been performed.

8. The data processing method as claimed in claim 5, further comprising:
   re-determining to use the SLC memory block or the MLC memory block or both the SLC memory block and the MLC memory block to receive data to receive data in a next predetermined period.

* * * * *